United States Patent
Benveniste et al.

(10) Patent No.: US 7,019,314 B1
(45) Date of Patent: Mar. 28, 2006

(54) SYSTEMS AND METHODS FOR ION BEAM FOCUSING

(75) Inventors: Victor M. Benveniste, Gloucester, MA (US); Peter L. Kellerman, Essex, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 10/967,855

(22) Filed: Oct. 18, 2004

(51) Int. Cl.
*H01L 21/324* (2006.01)
*H01J 37/317* (2006.01)
*H01J 49/30* (2006.01)

(52) U.S. Cl. .................. 250/492.21; 250/396 ML; 250/290; 250/293; 250/295; 250/297; 250/298

(58) Field of Classification Search .............. None
See application file for complete search history.

(56) References Cited

U.S. PATENT DOCUMENTS

| 4,687,936 A | * | 8/1987 | McIntyre et al. ........... 250/397 |
| 4,914,305 A | | 4/1990 | Benveniste et al. |
| 5,373,164 A | * | 12/1994 | Benveniste ............ 250/492.21 |
| 5,736,743 A | | 4/1998 | Benveniste |
| 5,780,863 A | | 7/1998 | Benveniste et al. |
| 5,900,667 A | * | 5/1999 | Veneklasen et al. ........ 257/429 |
| 6,207,963 B1 | * | 3/2001 | Benveniste ............ 250/492.21 |
| 6,403,967 B1 | | 6/2002 | Chen et al. |
| 6,768,117 B1 | * | 7/2004 | Veneklasen et al. . 250/396 ML |
| 6,774,377 B1 | | 8/2004 | Rathmell et al. |
| 6,903,350 B1 | * | 6/2005 | Vanderberg et al. ... 250/492.21 |
| 6,924,494 B1 | * | 8/2005 | Veneklasen et al. ... 250/492.22 |
| 2004/0217304 A1 | * | 11/2004 | Veneklasen et al. ..... 250/492.2 |

\* cited by examiner

*Primary Examiner*—Nikita Wells
*Assistant Examiner*—Bernard E. Souw
(74) *Attorney, Agent, or Firm*—Eschweiler & Associates, LLC

(57) ABSTRACT

Systems and methods are provided for focusing a scanned ion beam in an ion implanter. A beam focusing system is provided, comprising first and second magnets providing corresponding magnetic fields that cooperatively provide a magnetic focusing field having a time-varying focusing field center generally corresponding to a time-varying beam position of a scanned ion beam along a scan direction. Methods are presented, comprising providing a focusing field having a focusing field center in the scan plane, and dynamically adjusting the focusing field such that the focusing field center is generally coincident with a time-varying beam position of the scanned ion beam along the scan direction.

29 Claims, 15 Drawing Sheets

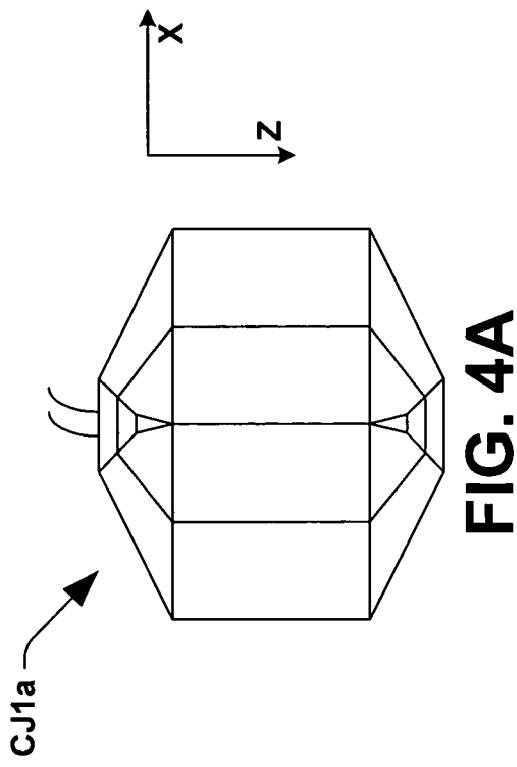
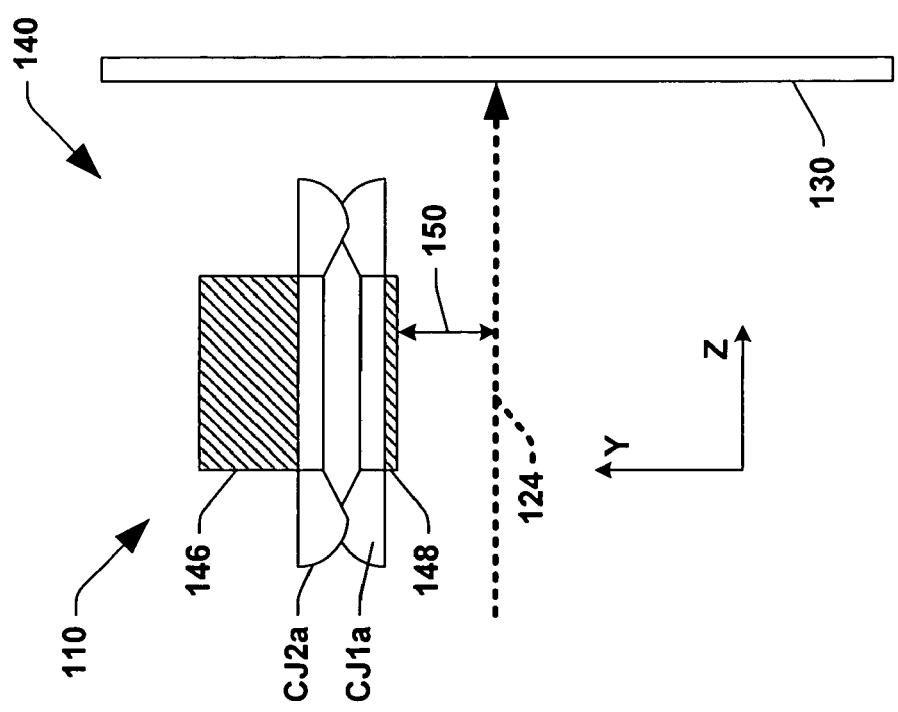

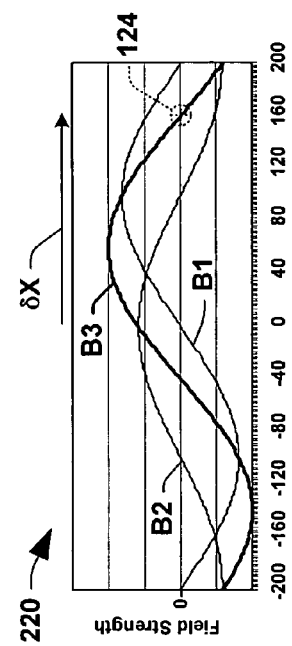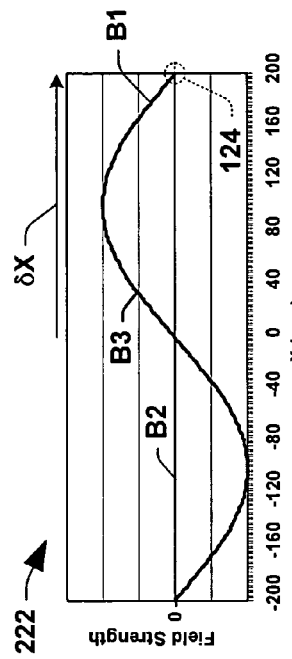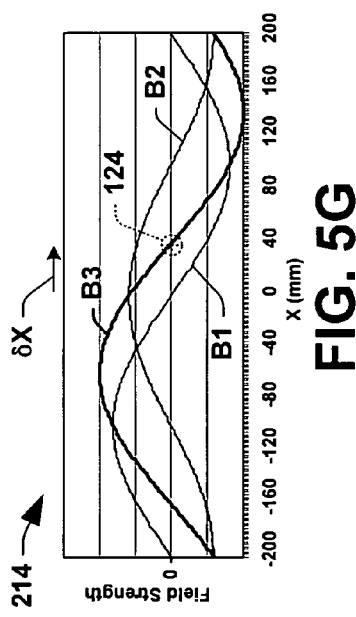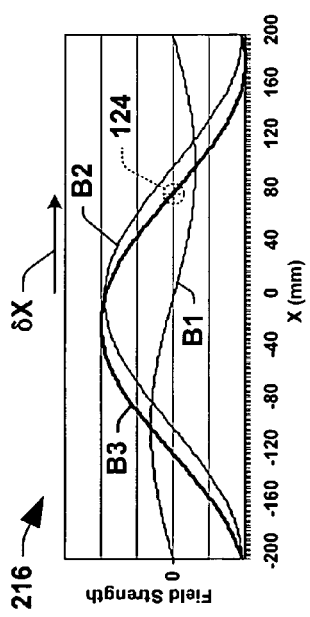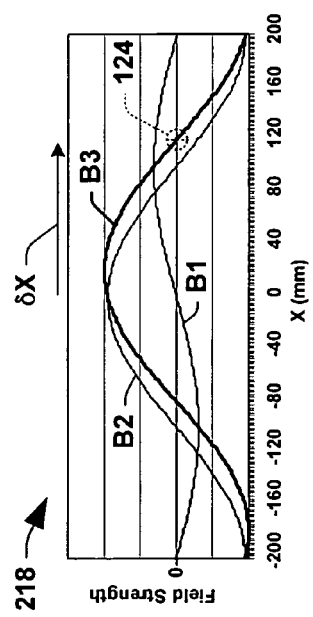

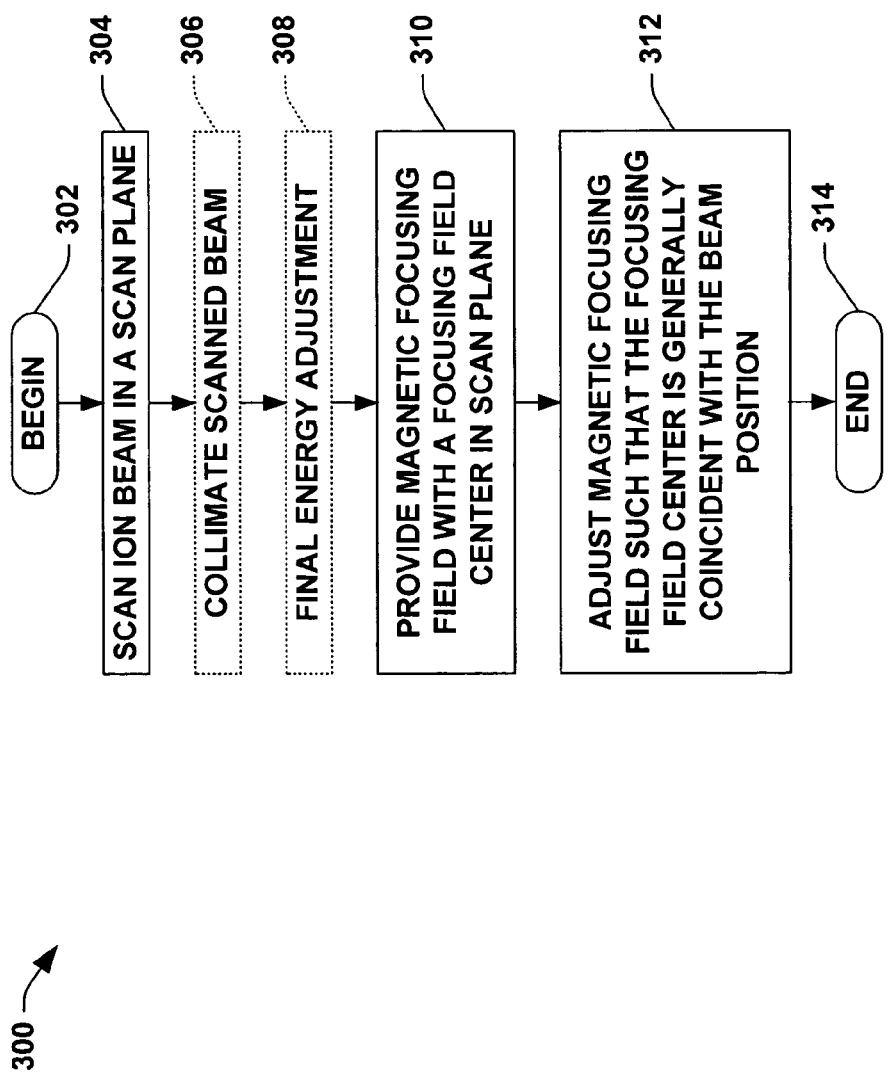

SYSTEMS AND METHODS FOR ION BEAM FOCUSING

FIELD OF THE INVENTION

The present invention relates generally to ion implantation systems, and more specifically to focusing apparatus and methods for focusing scanned ion beams in ion implantation systems.

BACKGROUND OF THE INVENTION

In the manufacture of semiconductor devices and other products, ion implantation is used to dope semiconductor wafers, display panels, or other workpieces with impurities. Ion implanters or ion implantation systems treat a workpiece with an ion beam, to produce n or p-type doped regions or to form passivation layers in the workpiece. When used for doping semiconductor wafers, the ion implantation system injects a selected ion species into the wafer to produce the desired extrinsic material, wherein implanting ions generated from source materials such as antimony, arsenic or phosphorus results in n-type extrinsic material wafers, and implanting materials such as boron, gallium or indium creates p-type extrinsic material portions in a semiconductor wafer.

FIG. 1 illustrates a conventional ion implantation system 10 having a terminal 12, a beamline assembly 14, and an end station 16. The terminal 12 includes an ion source 20 powered by a high voltage power supply 22 that produces and directs an ion beam 24 to the beamline assembly 14. The beamline assembly 14 consists of a beamguide 32 and a mass analyzer 26 in which a dipole magnetic field is established to pass only ions of appropriate charge-to-mass ratio through a resolving aperture 34 at an exit end of the beamguide 32 to a workpiece 30 (e.g., a semiconductor wafer, display panel, etc.) in the end station 16. The ion source 20 generates charged ions that are extracted from the source 20 and formed into the ion beam 24, which is directed along a beam path in the beamline assembly 14 to the end station 16. The ion implantation system 10 may include beam forming and shaping structures extending between the ion source 20 and the end station 16, which maintain the ion beam 24 and bound an elongated interior cavity or passageway through which the beam 24 is transported to one or more workpieces 30 supported in the end station 16. The ion beam transport passageway is typically evacuated to reduce the probability of ions being deflected from the beam path through collisions with air molecules.

Low energy implanters are typically designed to provide ion beams of a few hundred electron volts (eV) up to around 80–100 keV, whereas high energy implanters can employ linear acceleration (linac) apparatus (not shown) between the mass analyzer 26 and the end station 16, so as to accelerate the mass analyzed beam 24 to higher energies, typically several hundred keV, wherein DC acceleration is also possible. High energy ion implantation is commonly employed for deeper implants in the workpiece 30. Conversely, high current, low energy ion beams 24 are typically employed for high dose, shallow depth ion implantation, in which case the lower energy of the ions commonly causes difficulties in maintaining convergence of the ion beam 24. Different forms of end stations 16 are found in conventional implanters. "Batch" type end stations can simultaneously support multiple workpieces 30 on a rotating support structure, with the workpieces 30 being rotated through the path of the ion beam until all the workpieces 30 are completely implanted. A "serial" type end station, on the other hand, supports a single workpiece 30 along the beam path for implantation, whereby multiple workpieces 30 are implanted one at a time in serial fashion, with each workpiece 30 being completely implanted before implantation of the next workpiece 30 begins.

The implantation system 10 of FIG. 1 includes a serial end station 16, wherein the beamline assembly 14 includes a lateral beam scanner 36 that receives the ion beam 24 having a relatively narrow profile (e.g., a "pencil" beam), and scans the beam 24 back and forth in the X-direction (e.g., along a lateral scan direction in a horizontal scan plane) to spread the beam 24 out into an elongated "ribbon" profile (e.g., referred to as a scanned beam or a ribbon beam) having an effective X-direction width that is at least as wide as the workpiece 30. The ribbon beam 24 is then passed through a parallelizer or collimator 38 that directs the ribbon beam generally parallel to the Z-direction toward the workpiece 30 (e.g., the parallelized beam 24 is generally normal to the workpiece surface for non-angled implants). A final energy adjustment system 39 is located between the parallelizer 38 and the location of the workpiece 30, which operates to accelerate or decelerate the scanned and parallelized (e.g., collimated) beam 24. The workpiece 30 is mechanically translated in another orthogonal direction (e.g., a "Y" direction in and out of the page in FIG. 1), wherein a mechanical actuation apparatus (not shown) translates the workpiece 30 in the Y-direction during X-direction beam scanning by the beam scanner 36, whereby the beam 24 is imparted on the entire exposed surface of the workpiece 30. The X-direction beam scanning is commonly referred to as a "fast scan", whereas the mechanical translation of the workpiece 30 along the Y-direction is referred to as a "slow scan".

In the manufacture of integrated circuit devices and other products, it is desirable to uniformly implant the dopant species across the entire workpiece 30. As the ion beam 24 is transported along the beam path toward the workpiece 30, the beam 24 encounters various electric and/or magnetic fields and devices that may alter the beam dimensions and/or the integrity of the beam 24, leading to non-uniformity of dopants in the implanted workpiece 30. Absent countermeasures, space charge effects, including mutual repulsion of positively charged beam ions, tend to diverge the beam 24 (e.g., possibly leading to beam "blowup"). Low energy ion beams 24 are particularly susceptible to beam divergence or beam blowup when transported over long distances. Furthermore, where the final energy adjustment system 39 is operated so as to decelerate the ions of the beam 24, the space charge effects are more pronounced in the deceleration gap between the collimator 38 and the workpiece 30. Accordingly, it is desirable to focus the scanned ion beam 24 after collimation to counteract the heightened mutual repulsion of the decelerated beam 24.

SUMMARY OF THE INVENTION

The following presents a simplified summary of the invention in order to provide a basic understanding of some aspects of the invention. This summary is not an extensive overview of the invention, and is neither intended to identify key or critical elements of the invention nor to delineate the scope of the invention. Rather, the purpose of the summary is to present some concepts of the invention in a simplified form as a prelude to the more detailed description that is presented later.

The invention provides systems and methods for focusing scanned ion beams in ion implanters that may be employed to mitigate beam blowup or other beam profile distortion as the scanned ion beam travels between a beam scanner and a workpiece location. The invention may thus advantageously provide improved control of incident beam uniformity, and hence help to control the implantation uniformity of semiconductor wafers, display panels, or other workpieces. The invention provides beam focusing fields along a portion of a scan plane of a scanned ion beam, with a time varying focusing field center, where the center is temporally translated along the scan direction to be generally spatially coincident with the time-varying position of the scanned ion beam along the scan direction. In this manner, the scanned beam may be advantageously focused prior to incidence on the workpiece surface, even where post-collimation deceleration has increased the tendency of the beam to blow up or otherwise deviate from a desired beam profile.

One aspect of the invention relates to an ion implantation system or ion implanter, comprising an ion source that produces an ion beam, and a beam scanner that receives the ion beam and directs a scanned ion beam in a scan plane toward a workpiece location. The scanned ion beam has a time-varying beam position along a scan direction, wherein the beam at any given point in time is generally within the scan plane at a beam position along the scan direction. The ion implantation system further comprises a beam focusing system that provides a focusing field along a portion of the scan plane between the beam scanner and the workpiece location. The focusing field has a focusing field center in the scan plane at a time-varying location along the scan direction, where the beam focusing system changes or dynamically adjusts the focusing field center position along the scan direction to be generally coincident in space with the time-varying beam position. In this manner, the beam can be focused after scanning and prior to impinging upon the workpiece, whereby improved implantation uniformity control can be facilitated.

In one example, a magnetic focusing field is provided, which has a substantially zero field strength at the focusing field center, with a magnetic field strength gradient that is generally linear along the scan direction proximate the focusing field center. The gradient in this case provides for controllable converging forces to be applied on either lateral side of the scanned ion beam so as to combat beam divergence, particularly where the scanned beam has been decelerated prior to encountering the workpiece. In one implementation, the magnetic focusing field has a substantially sinusoidal distribution along the scan direction with a zero crossing at the focusing field center, wherein the beam focusing system may include first and second magnets for created superimposed first and second magnetic fields. In this case, the first and second magnetic field may individually have a substantially sinusoidal field distribution along the scan direction with a fixed wavelength, where the first and second field distributions are offset from one another by a quarter wavelength along the scan direction. The amplitudes of the first and second magnetic fields may be varied over time according to the time-varying beam position along the scan direction, so as to provide the time-varying focusing field center of the magnetic focusing field generally coincident with the time-varying beam position along the scan direction.

In another example, the beam focusing system may again comprise first and second magnets between the scanner and the workpiece location that provide corresponding first and second magnetic field along the portion of the scan plane, where the first magnetic field is a quadrupole field and the second magnetic field is a dipole field. The quadrupole and dipole fields are superimposed with one another along the scan plane to create the magnetic focusing field, where an amplitude of the dipole field is varied over time according to the time-varying beam position to provide the time-varying focusing field center of the magnetic focusing field generally coincident with the time-varying beam position along the scan direction.

Another aspect of the invention provides a beam focusing system for producing a focusing field along a portion of a scan plane between a beam scanner and a workpiece location in an ion implantation system. The beam focusing system may comprise a first magnet providing a first magnetic field along the portion of the scan plane, and a second magnet providing a second magnetic field superimposed on the first magnetic field along the portion of the scan plane. These magnetic fields cooperatively provide a magnetic focusing field having a time-varying focusing field center generally corresponding to a time-varying beam position of a scanned ion beam along a scan direction.

Yet another aspect of the invention provides a method for focusing a scanned ion beam along a portion of a scan plane between a beam scanner and a workpiece location in an ion implantation system. The method comprises providing a focusing field having a focusing field center in the scan plane, and dynamically adjusting the focusing field such that the focusing field center is generally coincident with a time-varying beam position of the scanned ion beam along the scan direction. The focusing field may be created by providing a first magnetic field along the portion of the scan plane, and providing a second magnetic field superimposed on the first magnetic field. The dynamic adjustment of the focusing field in this case may comprise adjusting one or both of the first and second magnetic fields such that the focusing field center is generally coincident with the time-varying beam position along the scan direction. In one example, the first magnetic field has a first substantially sinusoidal field distribution along the scan direction with a fixed first wavelength, and the second magnetic field has a second substantially sinusoidal field distribution along the scan direction with a fixed second wavelength, where the first and second wavelengths are substantially equal and the field distributions are offset from one another by a quarter wavelength along the scan direction. In this example, dynamically adjusting the magnetic focusing field may comprise varying amplitudes of the first and second magnetic fields over time according to the time-varying beam position along the scan direction such that the focusing field center is generally coincident with the time-varying beam position along the scan direction. In another example, the first magnetic field is a quadrupole field and the second magnetic field is a dipole field, wherein the dynamic adjustment of the magnetic focusing field may comprise varying an amplitude of the second magnetic field over time according to the time-varying beam position along the scan direction such that the focusing field center is generally coincident with the time-varying beam position.

The following description and annexed drawings set forth in detail certain illustrative aspects and implementations of the invention. These are indicative of but a few of the various ways in which the principles of the invention may be employed.

BRIEF DESCRIPTION OF THE DRAWINGS

FIG. 3D is a partial side elevation view in section taken along line 3D—3D of FIGS. 3A–3C, further illustrating the first and second magnets in the first exemplary beam focusing system;

FIGS. 4A–4C are top plan, end elevation, and perspective views, respectively, illustrating an exemplary magnet coil of the first magnet in the first exemplary beam focusing system of FIGS. 3A–3D;

FIGS. 5A–5K are graphs illustrating magnetic field strength in the horizontal beam scan plane as a function of location along the lateral scan direction (X-direction) at various discrete times during scanning of the ion beam in the first exemplary beam focusing system of FIGS. 3A–3D, including field strength curves for the first and second magnetic fields as well as the composite magnetic focusing field resulting from superposition of the first and second magnetic fields in the beam scan plane;

FIG. 8 is a flow diagram illustrating an exemplary method of focusing a scanned ion beam in accordance with the invention.

DETAILED DESCRIPTION OF THE INVENTION

Figure 1:
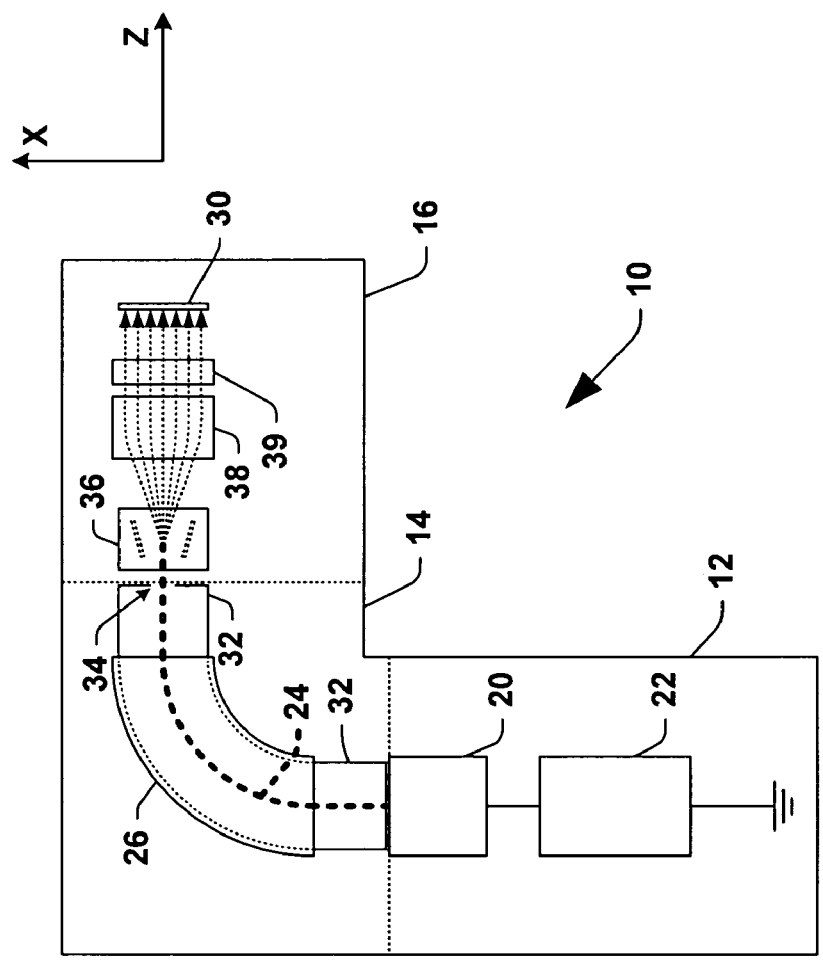
FIG. 1 is a simplified top plan view illustrating a conventional ion implantation system with a beam scanner, a parallelizer, and a final energy adjustment system.

The present invention will now be described with reference to the drawings wherein like reference numerals are used to refer to like elements throughout, and wherein the illustrated structures are not necessarily drawn to scale.

Figure 2:
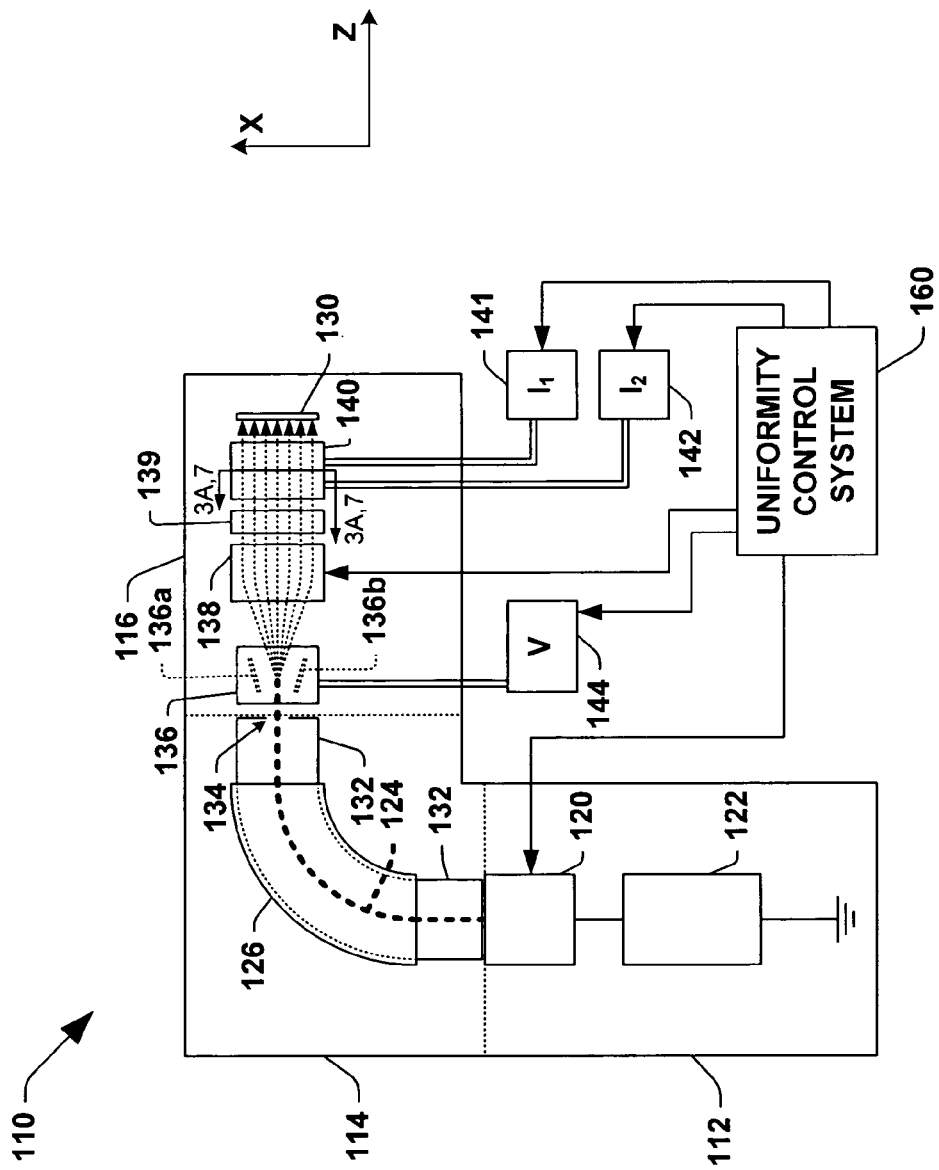
FIG. 2 is a top plan view illustrating an exemplary ion implantation system and a beam focusing system therefor in accordance with one or more aspects of the present invention.

Referring initially to FIG. 2, an exemplary ion implantation system (ion implanter) 110 is illustrated, having a beam scanner 136 and a beam focusing system 140 in accordance with one or more aspects of the invention. The exemplary ion implantation system 110 comprises a terminal 112, a beamline assembly 114, and an end station 116 that forms a process chamber in which a mass analyzed and scanned ion beam 124 is directed to a workpiece location. An ion source 120 in the terminal 112 is powered by a power supply 122 to provide an extracted ion beam 124 to the beamline assembly 114, wherein the source 120 includes one or more extraction electrodes (not shown) to extract ions from the source chamber and thereby to direct the extracted ion beam 124 toward the beamline assembly 114. Any suitable ion source may be employed in an ion implantation system in accordance with the invention.

The beamline assembly 114 comprises a beamguide 132 having an entrance near the source 120 and an exit with an exit aperture 134, as well as a mass analyzer 126 that receives the extracted ion beam 124 and creates a dipole magnetic field to pass only ions of appropriate energy-to-mass ratio or range thereof (e.g., a mass analyzed ion beam 124 having ions of a desired mass range) through the resolving aperture 134 toward the workpiece 130 in a workpiece location of the end station 116. Various beam forming and shaping structures (not shown) may be provided in the beamline assembly to maintain the ion beam 124 and which bound an elongated interior cavity or passageway through which the beam 124 is transported along a beam path to the workpiece location of the end station 116.

A beam scanner 136 is provided downstream of the exit aperture 134, which receives the mass analyzed ion beam 124 and directs a scanned ion beam 124 to a parallelizer or collimator 138 that operates to parallelize the scanned ion beam 124. A final energy adjustment system 139 is provided between the parallelizer 138 and the workpiece 130, which may be selectively operated to provide acceleration or deceleration prior to the beam 124 impinging on the workpiece 130. In accordance with the invention, a beam focusing system or traveling lens 140 is provided downstream of the scanner 136 between the final energy adjustment system 139 and the workpiece 130 in the end station 116, where the system 140 provides lateral focusing of the scanned ion beam 124 to inhibit or prevent beam blowup or other distortion of the beam profile as it is transported to the workpiece location. While the exemplary system 110 includes a parallelizer 138 and a final energy adjustment system, these components are not a requirement of the present invention. As illustrated in FIG. 2, first and second current sources 141 and 142 are provided to generate coil currents to first and second magnets, respectively, of the beam focusing system 140 as described further below, along with a scanner voltage source 144, where the sources 141, 142, and 144 are controlled by a uniformity control system 160. The control system 160 further controls the ion source 120 and may receive various feedback and other input signals (not shown) from various sensors and components of the implantation system 110 in order to achieve a desired implant beam uniformity, dose, energy, etc.

Any suitable beam scanner 136 may be employed in an ion implantation system of the invention, which is operable to receive an incoming ion beam and to direct the beam back and forth in a scan plane along a scan direction over time. In the system 110, the scanner 136 scans the mass analyzed ion beam along a scan direction or axis (e.g., back and forth in the X-direction in a generally horizontal scan plane) at a certain scan frequency to accomplish a fast scan of the beam 124, with the workpiece 130 being translated in a different direction (e.g., the Y-direction in one example) to achieve a slow scan, wherein the slow scan and fast scan provide for essentially complete implantation of the workpiece surface. Although the invention is illustrated and described herein in the context of an electrical beam scanner 136, other beam scanner types are possible, including but not limited to magnetic scanners, wherein all such alternate implementations are contemplated as falling within the scope of the present invention and the appended claims.

The exemplary scanner 136 includes a pair of scanning electrodes or scan plates 136a and 136b, as shown in FIG. 2, which are located on either lateral side of the beam path, where the voltage source 144 provides alternating voltages to the electrodes 136a and 136b to accomplish the X-direction scanning of the ion beam 124. The time-varying differential scan voltage between the scan electrodes 136a and 136b creates a time varying electric field across the beam path between the electrodes 136a and 136b, by which the beam 124 is bent or deflected (e.g., scanned) across the scan direction to provide a ribbon-shaped scanned ion beam 124 to the parallelizer 138. For example, when the scanning field is in the direction from the electrode 136a to the electrode 136b (e.g., the potential of electrode 136a is more positive than the potential of electrode 136b), the positively charged ions of the beam 124 are subjected to a lateral force in the negative X direction (e.g., toward the electrode 136b), wherein the converse is true when the scanning field is in the opposite direction. In one example, the differential voltage provided by the source 144 may be a simple triangle waveform to accomplish an essentially linear lateral scanning of the beam 124 in the X-direction, although any scanning voltages and waveforms are possible within the scope of the invention.

In accordance with another aspect of the invention, the control system 160 controls the scanner voltage source 144 and the current sources 141, 142 in a coordinated fashion so as to provide for a magnetic focusing field that travels back and forth along the X-direction (e.g., along the scan direction) in concert with the scanned beam, whereby the focusing center of the magnetic focusing field is generally coincident in space with the time-varying beam position along the scan direction in a portion of the scan plane between the scanner 136 and the location of the workpiece 130. Other arrangements are possible within the scope of the invention, wherein a beam focusing system provides a magnetic or electric or other type of focusing field having a focusing field center in the scan plane, which is dynamically adjusted such that the location of the focusing field center is generally coincident with or generally corresponds to a time-varying beam position of the scanned ion beam along the scan direction, wherein the illustrated magnetic system 140 is merely exemplary. In this regard, the focusing center may be any portion of a magnetic or other focusing field which tends to provide a desired focusing (e.g., convergent or divergent, as desired) of an ion beam, wherein the focusing field may provide one or more such focusing centers along the portion of the scan plane proximate the focusing system 140, where at least one such focusing center is located generally spatially coincident with or generally corresponding in space to a time-varying beam position of the scanned ion beam along the scan direction.

In the exemplary system 140, the magnetic focusing center tends to converge the beam 124 in the X-direction, wherein Y-direction focusing can be achieved by other suitable focusing apparatus (not shown) as needed. It is noted in this regard, that absent focusing apparatus, the beam 124 may tend to diverge in both the X and Y directions, particularly if decelerated by the final energy adjustment system 139, due to mutual repulsion or other effects prior to impinging on the workpiece surface. Since the beam 124 is being scanned in a generally horizontal scan plane, static focusing means can be provided for Y-direction focusing to counteract unwanted Y-direction divergence, but such means cannot combat the X-direction divergence, since the beam is moving in the X-direction. However, such Y-direction focusing elements are not a strict requirement of the present invention.

The exemplary focusing field center in the system 140 is a location where the magnetic field strength is substantially zero, with field amplitudes of opposite polarity on either side of the focusing field center, such that ions that are laterally to either side of the field center will be directed toward the center, whereby the magnetic focusing field tends to oppose lateral (e.g., X-direction) divergence of the scanned ion beam 124. In the illustrated implementations of the invention, moreover, the magnetic focusing field has a field gradient that is generally linear along the scan direction (the X-direction) proximate the focusing field center. It is noted that the general coincidence of the focusing field center and the time-varying beam position includes location of the field center and the beam at any relative positions along the scan direction in that portion of the scan plane proximate the focusing system 140 that causes a desired focusing effect on the scanned beam 124, regardless of whether such effect provides a resulting beam that is convergent or divergent in the scan direction, wherein the invention and the appended claims are not limited to the illustrated examples.

In the illustrated implanter 110, the focusing system 140 changes the position of the focusing field center in concert with the scanning of the ion beam 124 by the scanner 136 through coordinated control of the current and voltage sources 141, 142, and 144 by the uniformity control system 160, which may also perform other functions in the system 110, although a separate control system may be provided for operating the scanner voltage supply 144 and the focusing system current supplies 141 and 142, or other control configurations may be employed by which the focusing field center is dynamically adjusted over time to generally correspond spatially with the beam location. FIGS. 3A–6D illustrate a first exemplary beam focusing system 140 in the implantation system 110 of FIG. 2, and FIG. 7 illustrates a second exemplary beam focusing system 240 in the implanter 110 within the scope of the present invention.

Referring now to FIGS. 3A–3D, the first exemplary beam focusing system 140 provides a magnetic focusing field having a substantially sinusoidal distribution along the scan direction (X-direction), with a zero crossing at the focusing field center. In this system 140, a first magnet is provided, comprising coils CJ1a and CJ1b located above and proximate to the path of the beam 124, where the first magnet extends generally along the X-direction above the lateral extent of the scanned beam 124. A second magnet is also provided above the beam path, comprising magnet coils CJ2a, CJ2b, and CJ2c, which are located above and interspersed with the first magnet coils CJ1a and CJ1b. The coils CJ1a, CJ1b, CJ2a, CJ2b, and CJ2c are situated between a laminated steel return yoke 146 and a laminated coil shield 148, where the shield 148 is spaced from the beam path by a distance 150 of about 30 to 40 mm in the illustrated system 140. The individual coils of the first and second magnets are substantially identical in the exemplary system 140, as illustrated and described further below with respect to FIGS. 4A–4D, although this is not a requirement of the invention.

Figure 3A:
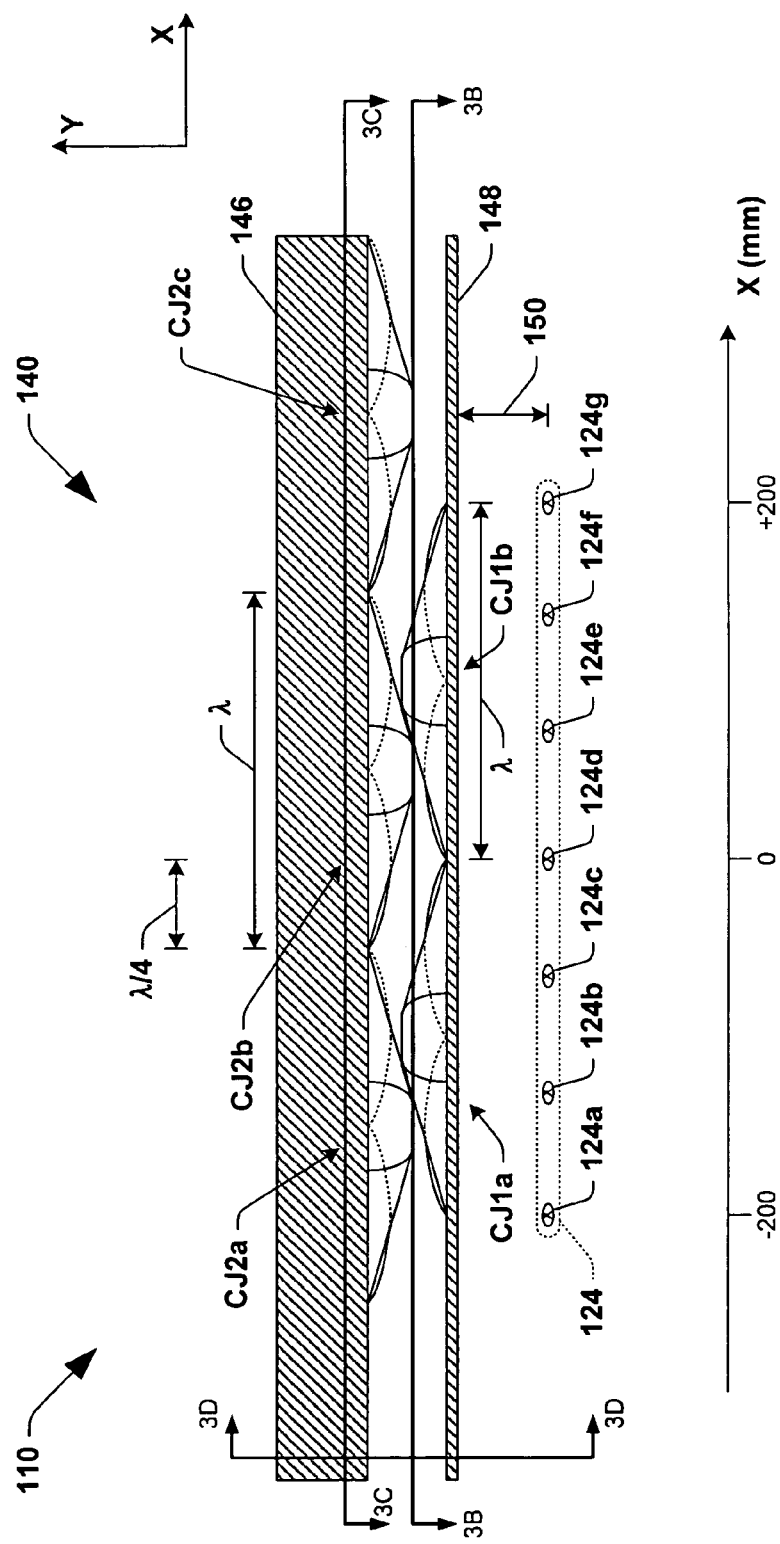
FIG. 3A is a partial end elevation view in section taken along line 3A—3A in the system of FIG. 2, illustrating details of a first exemplary beam focusing system with first and second magnets positioned above a generally horizontal beam scan plane to provide a magnetic focusing field through superposition of first and second substantially sinusoidal magnetic fields, where the magnetic focusing field has a focusing field center in the scan plane that is generally coincident in space with the time-varying beam position along the scan direction in accordance with the invention.
Figure 3B:
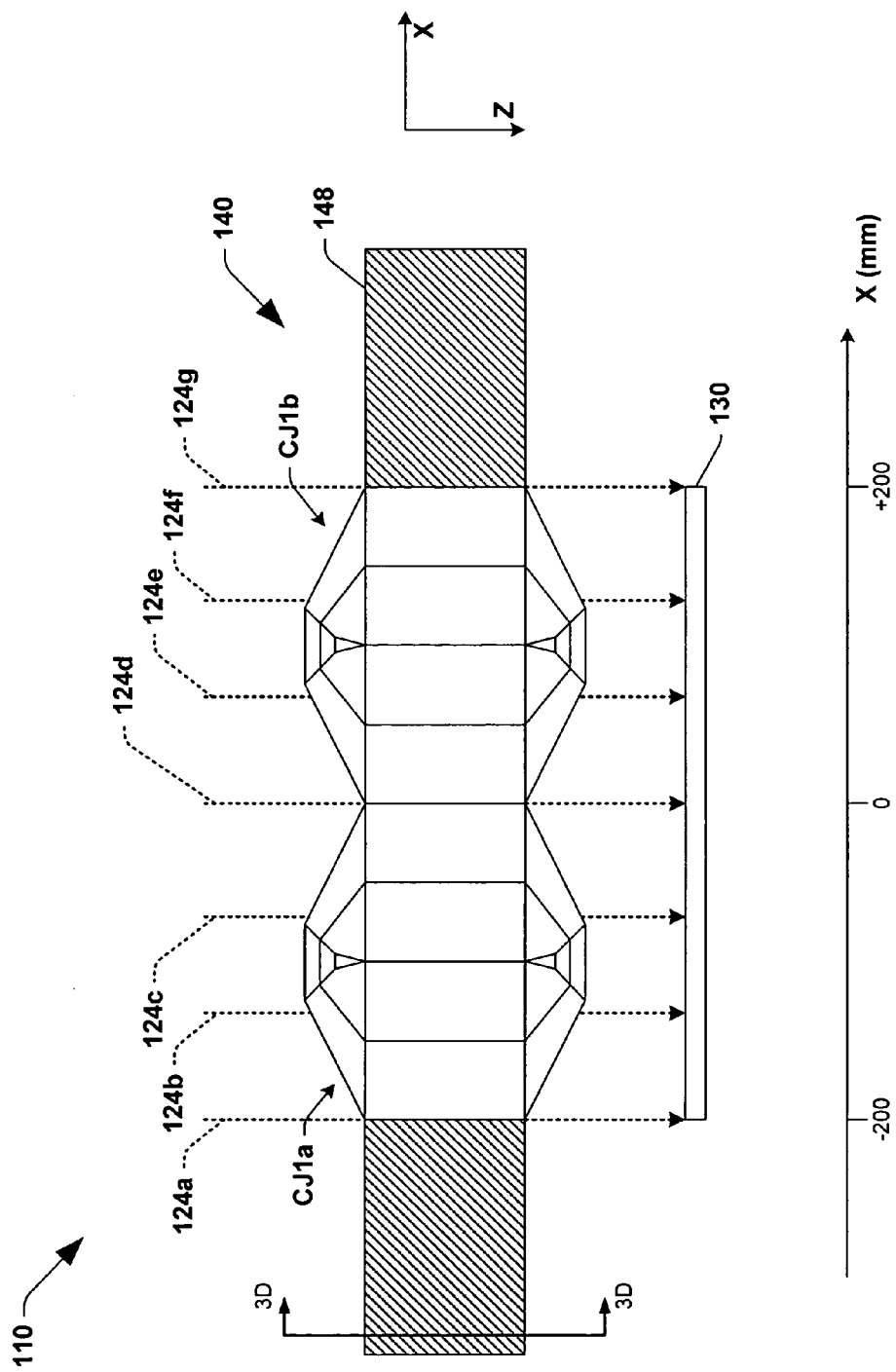
FIGS. 3B and 3C are partial top plan views in section taken along lines 3B—3B and 3C—3C, respectively, in FIG. 3A, illustrating further details of the exemplary first and second magnets and the coils thereof in the first exemplary beam focusing system.
Figure 3C:
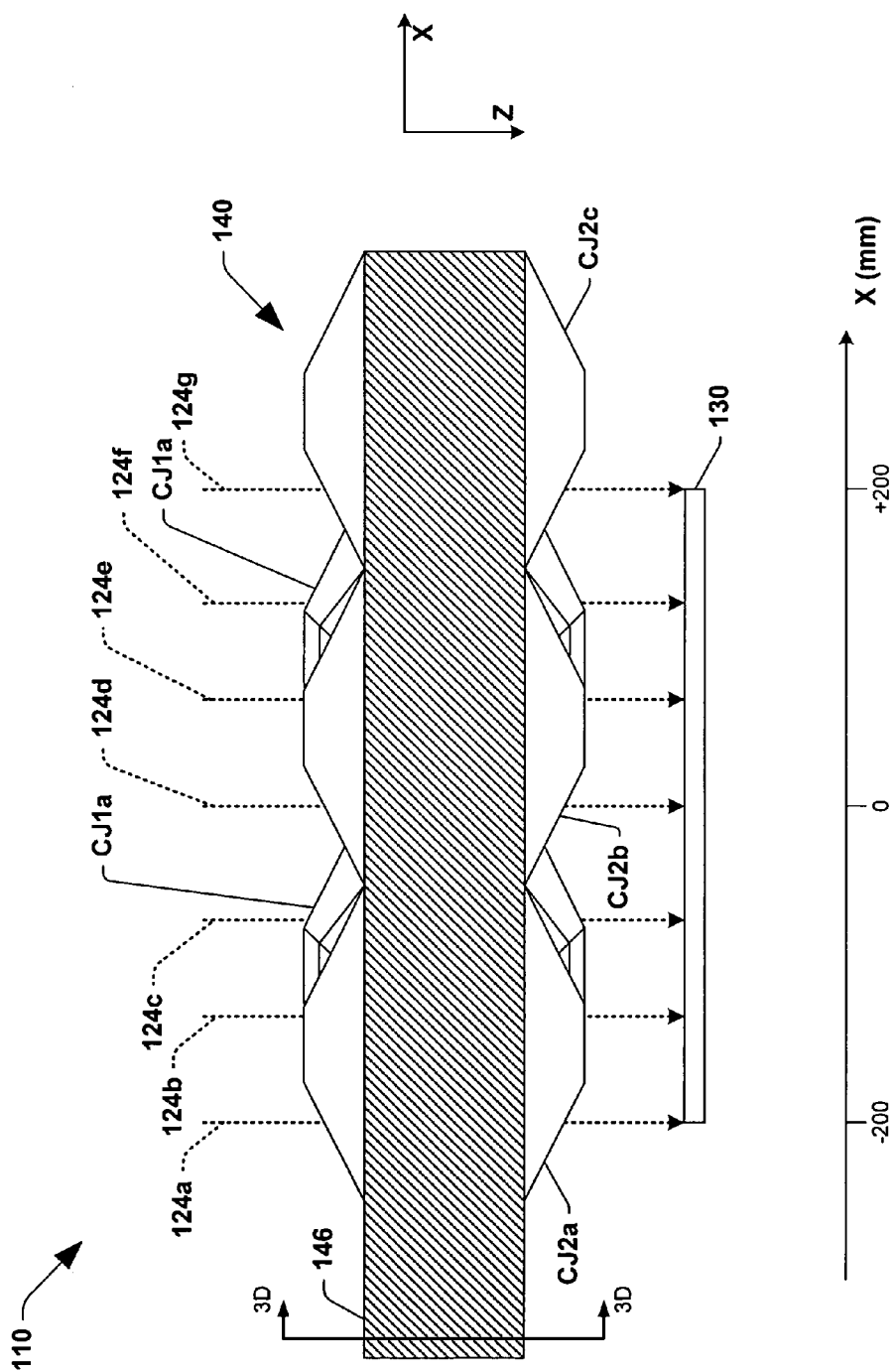

The scanned ion beam 124 is illustrated in FIGS. 3A–3C at several discrete points in time during a scan across the scan direction, where the illustrated exemplary beam positions are labeled 124a–124g (e.g., with the center of the scan field indicated in the figures as X=0 mm). The beam position 124a corresponds to an X-dimension of −200 mm, 124b corresponds to X=−120 mm, 124c corresponds to X=−80 mm, 124d corresponds to X=0 mm, 124e corresponds to X=+80 mm, 124f corresponds to X=+120 mm, and 124g corresponds to X=+200 mm. It is noted that in general, the beam position may be any time varying pattern, such as a smooth linear transition from side to side corresponding to a triangle voltage waveform applied by the voltage source 144 to the scanner 136 (FIG. 2), or any other waveform, wherein the pattern or form of the time-varying beam position is not critical to the invention.

The first and second magnets individually provide substantially sinusoidal magnetic field distributions along the scan direction, and the superposition of the first and second magnetic fields results in a composite sinusoidal field distribution in the scan plane along the scan direction. In particular, the coils CJ1a and CJ1b of the first magnet provided a first substantially sinusoidal field distribution along the scan direction with a fixed first wavelength λ, and the coils CJ2a, CJ2b, and CJ2c of the second magnet provide a second substantially sinusoidal field distribution with a fixed second wavelength λ along the scan direction in the portion of the scan plane proximate the system 140, where the first and second wavelengths λ are substantially equal. Moreover, the first and second substantially sinusoidal field distributions and the corresponding coils of the first and second magnets are offset from one another by approximately a quarter wavelength (λ/4) along the scan direction, as illustrated in FIG. 3A, although the exact amount of spatial offset is not critical to the invention. The coils individually comprise leads (not shown in FIGS. 3A–3D) for coupling to the respective current sources 141 and 142, where the coils CJ1a and CJ1b (collectively CJ1) of the first magnet may be connected in series with the first current source 141 (FIG. 2) such that a first current $I_1$ flows equally in each coil CJ1. Similarly, the coils CJ2a, CJ2b, and CJ2c (collectively CJ2) of the second magnet may be connected in series with the second current source 142 such that a second current $I_2$ flows equally in each coil CJ2. Other connections and magnet configurations are possible within the scope of the invention, wherein the number and location of coils, and the connection thereof to current sources is not critical to the invention.

The first and second magnetic fields are superimposed with one another along the portion of the scan plane proximate the magnets to create the magnetic focusing field, wherein the amplitudes of the first and second magnetic fields (e.g., the amount and polarity of the coil currents supplied by the first and second sources 141 and 142, respectively) are varied over time according to the time-varying beam position along the scan direction to locate the time-varying focusing field center of the magnetic focusing field generally coincident in space with the time-varying beam position along the scan direction, as illustrated and described in greater detail with respect to FIGS. 5A–5K below. As shown in FIG. 3A, the beam 124 is scanned along a lateral distance (scan range) of approximately 400 mm in the X-direction, wherein the wavelength λ of the first and second magnetic fields is about 200 mm, although these dimensions are merely examples and the invention is not limited to any particular dimensions or ratios thereof.

Figure 4C:
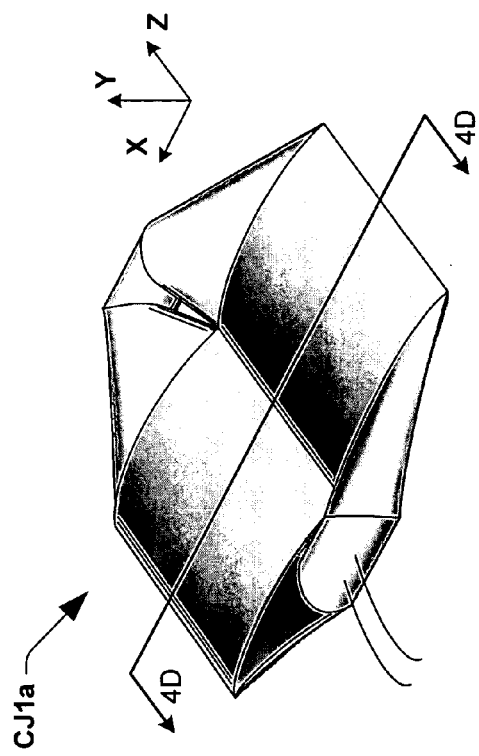
Figure 4B:
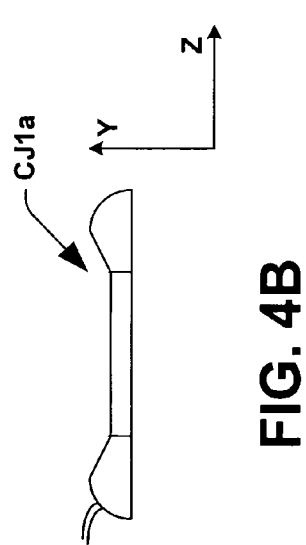
Figure 4D:
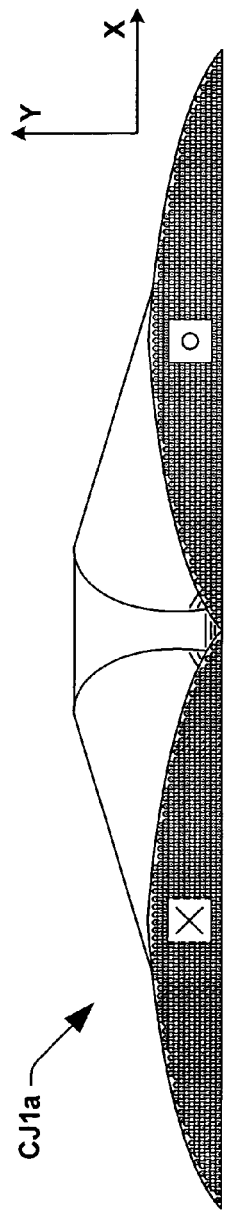
FIG. 4D is a partial end elevation view in section taken along the line 4D—4D in FIG. 4C, illustrating windings of the exemplary magnet coil of the first magnet in the first exemplary beam focusing system of FIGS. 3A–3D.

An exemplary magnet coil CJ1a is illustrated in FIGS. 4A–4D, wherein the coil CJ1a provides a sinusoidal current density profile along the scan direction, with positive current being illustrated into the page as a cross (FIG. 4D) and out of the page as a circle. As illustrated in FIG. 4D, the coil winding configuration is spatially substantially sinusoidal to generate sinusoidal current density with a fixed wavelength λ, although the sinusoidal shaping is not a strict requirement of the invention. However, it is noted that for a constant winding current, each of the exemplary magnet coils CJ creates a substantially sinusoidal magnetic field profile in the scan plane along the scan direction, with each coil CJ providing a full cycle or wavelength (λ) of a sine wave, where the coils of the first and second magnets are offset from one another by a quarter wavelength (λ/4) along the scan direction.

Referring now to FIGS. 2, 3A, and 5A–5K, graphs 202, 204, 206, 208, 210, 212, 214, 216, 218, 220, and 222 in FIGS. 5A–5K, respectively, illustrate magnetic field strength in the horizontal beam scan plane of the focusing system 140 as a function of location along the lateral scan direction (X-direction) at various discrete times during scanning of the ion beam 120, wherein the magnetic focusing field center is situated at the beam location by control of the magnet coil currents $I_1$ and $I_2$ according to the position of the scanned beam 124. These figures illustrate field strength curves B1 and B2 for the first and second magnetic fields, respectively, as well as the composite magnetic focusing field B3 resulting from superposition of the first and second magnetic fields B1 and B2 in the portion of the beam scan plane in the system 140. In this regard, it is noted that the focusing field center in this example is a point where the magnetic focusing field B3 crosses through zero (zero crossing) from positive to negative along the positive X-direction, although not a strict requirement of the invention.

In the exemplary system 140, the uniformity control system 160 controls the waveform of the beam scanner voltage source 144 according to a desired beam scanning pattern (e.g., triangle wave for linear beam scanning or other suitable waveform and pattern), and varies the amplitudes of the first and second magnetic fields B1 and B2 over time (e.g., by controlling the first and second current sources 141 and 142 and the corresponding magnet coil currents $I_1$ and $I_2$, respectively) according to the time-varying beam position along the scan direction, such that the focusing field center is generally coincident with the position of the scanned beam 124 at any point in time. In this particular implementation, the superposition of the two substantially sinusoidal magnetic field distributions B1 and B2 in a portion of the scan plane creates a composite sinusoidal magnetic field distribution B3, where controlled adjustment of the amplitudes of the fields B1 and B2 according to the beam position, causes the composite field distribution B3 and the focusing field center thereof to move or shift along the scan direction (e.g., the system 140 functions as a traveling lens). This operation allows placement of the focusing field center (e.g., a zero crossing of the field B3) to be situated at the beam location in time-varying fashion, whereby the system 140 can be employed to combat lateral divergence of the scanned ion beam 124 between the scanner 136 and the location of the workpiece 130.

In the illustrated implementation, the control system 160 controls the first and second magnet currents $I_1$ and $I_2$ according to the scanned beam position, where the scanned beam positions are indicated as δX (delta X) in FIGS. 5A–5K, as measured in mm from the lateral center of the scanned beam 124. In addition to controlling the magnet coil current sources 141 and 142, the exemplary control system 160 controls the beam scanner voltage source 144, although this is not a requirement of the invention. In particular, the amplitude of the first magnetic field B1 (e.g., the first current $I_1$) is controlled by the system 160 according to the following equation (1):

$$B1 = B^* \cos(\pi \delta x / \lambda) * \sin(\pi x / \lambda) \quad (1)$$

and the second magnetic field B2 e.g., the second current $I_2$) is controlled by the system 160 according to the following equation (2):

$$B2 = B^* \sin(\pi \delta x / \lambda) * \cos(\pi x / \lambda) \quad (2)$$

As can be seen in equations (1) and (2), the first terms vary as a function of the beam position δX, such that the amplitude of the individual fields B1 and B2 will depend on the scanned beam location at any given time, while the second terms correspond to the fixed sinusoidal winding distributions as seen in FIG. 3A. As such, the control system 160 accordingly controls the currents $I_1$ and $I_2$ depending upon the position of the scanned beam 124.

By superposition, the resulting composite field B3 (e.g., the net magnetic focusing field strength seen by the beam 124) is given by the following equation (3):

$$B3 = B1 + B2 = B^* \sin(\pi^*(\delta x + x)) \quad (3)$$

It is noted that the composite magnetic focusing field B3 will have a focusing center at zero crossings of the above equation (3), wherein the control system 160 adjusts the beam scanner voltage source 144 and the coil currents 136 $I_1$ and $I_2$ such that the focusing zero crossing of the B3 field is located at the beam location.

Figure 5D:
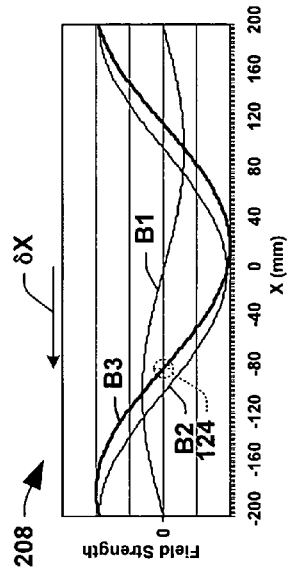
Figure 5E:
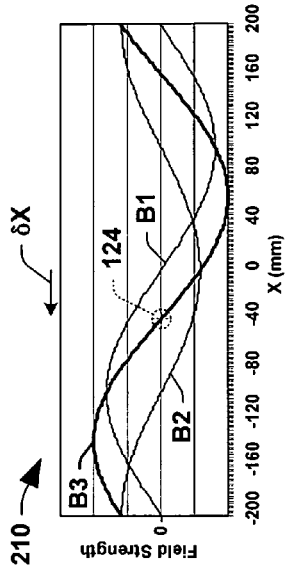
Figure 5F:
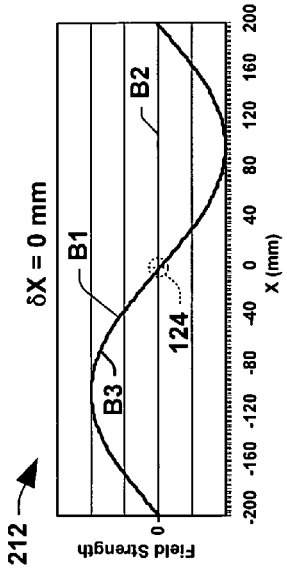
Figure 5A:
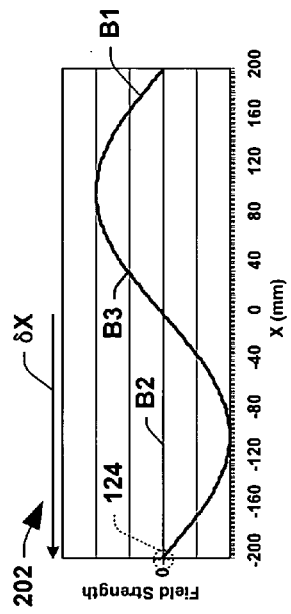
Figure 5B:
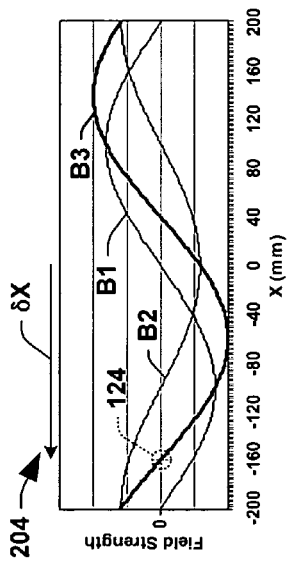
Figure 5C:
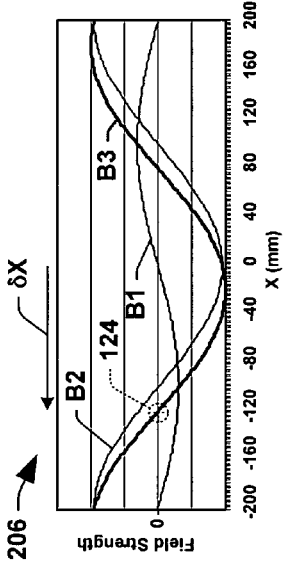

The graphs 202–222 in FIGS. 5A–5K illustrate the respective constituent and composite fields B1–B3 at several exemplary beam location (e.g., δX) values (e.g., every 40 mm) in the exemplary focusing system 140. In particular, the first graph 202 shows the situation for δX=−200 mm, where the beam 124 is at the far left of the scan field in FIG. 5A. For this δX value, the first magnetic field B1 has maximum amplitude, but the second magnetic field B2 is zero across the scan direction, whereby the resulting magnetic focusing field B3 has a field center at X=−200 mm. In FIG. 5B, with δX changed to −160 mm, the focusing field center of B3 moves in corresponding fashion to the location X=−140 mm. Similar behavior is seen in the graphs 206–210 in FIGS. 5C–5E, for δX values of −120 mm, −80 mm, and −40 mm, respectively, where the focusing field center generally corresponds to the location of the scanned beam 124 in each case.

The trend continues in FIG. 5F, where the beam 124 is located at a δX value of zero, at which point the first magnetic field B1 is maximum amplitude and B2 is zero. In this case, the net magnetic focusing field B3 has a focusing center at X=0 mm that is spatially coincident with the beam location along the scan direction. Further examples of the general operation of the system 140 and the magnetic fields B1–B3 thereof are shown in FIGS. 5G–5K for δX values of +40 mm, +80 mm, +120 mm, +160 mm, and +200 mm, respectively. It is noted that the magnetic focusing field B3 is the same for δX values of +200 mm (FIG. 5K) and −200 mm (FIG. 5A), due to the relationship between the scan field (+/−200 mm from the center) and the magnet coil wavelength λ (e.g., λ=200 mm in this example, as shown in FIG. 3A). However, the present invention is not limited to a particular relationship between the scan field length and the coil wavelength λ, wherein all such ratios thereof are contemplated as falling within the scope of the present invention and the appended claims.

Figure 6A:
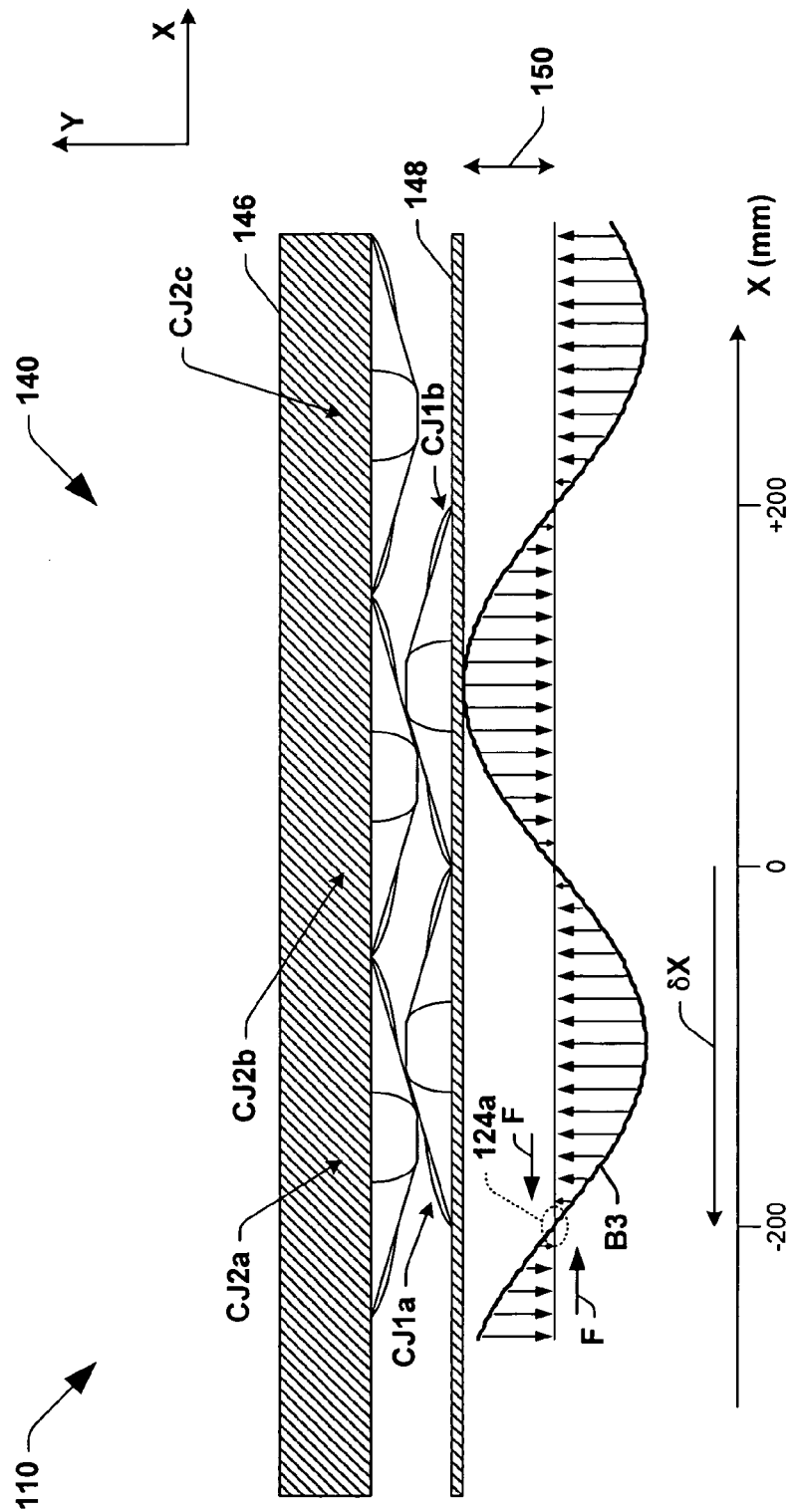
FIGS. 6A–6C are partial end elevation views in section taken along line 3A—3A of FIG. 2, illustrating the exemplary sinusoidal magnetic focusing field and the corresponding lateral focusing forces arising therefrom at three exemplary times, respectively, with the focusing field center in the scan plane that is generally coincident in space with the time-varying beam position.
Figure 6B:
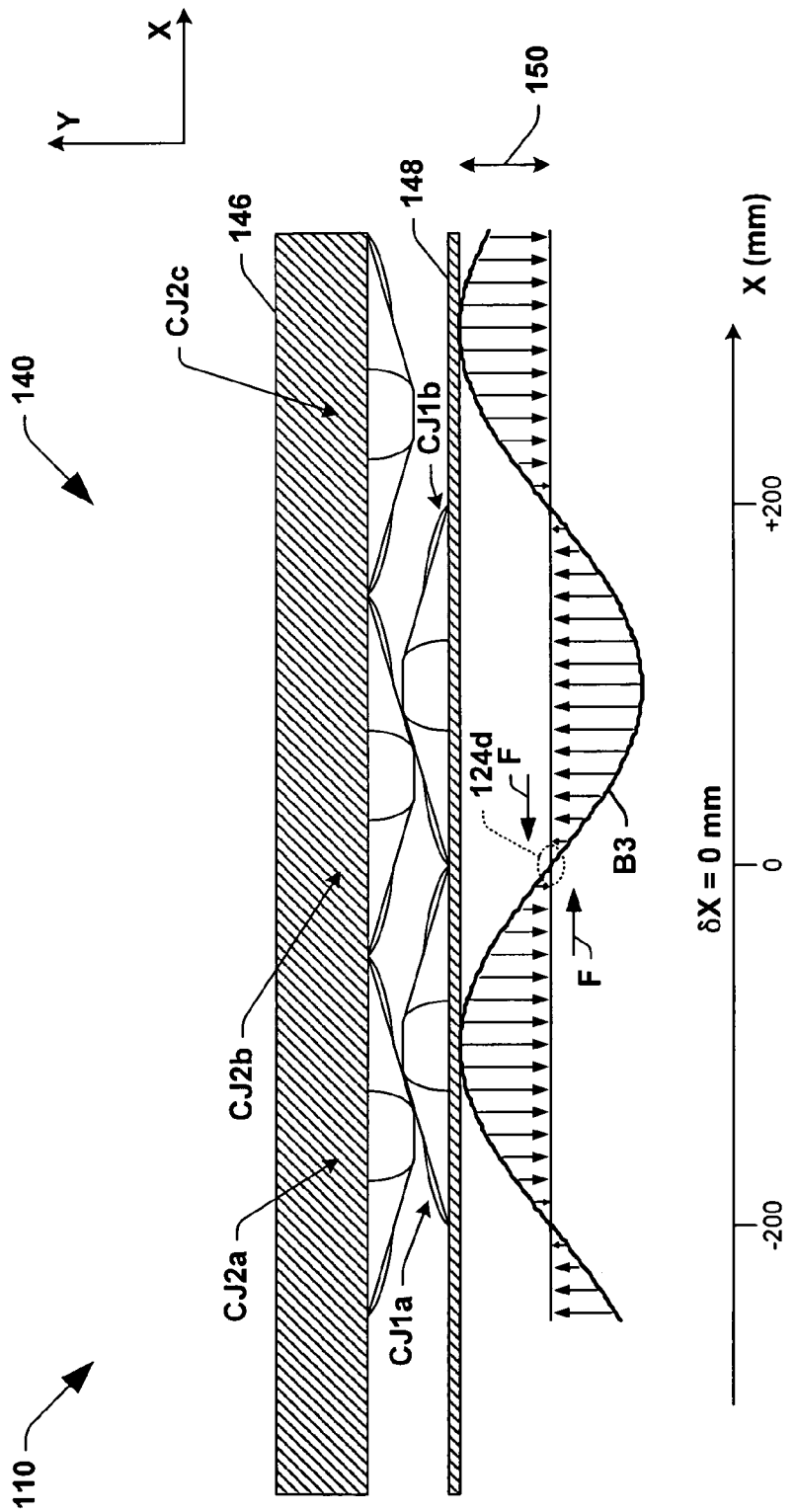
Figure 6C:
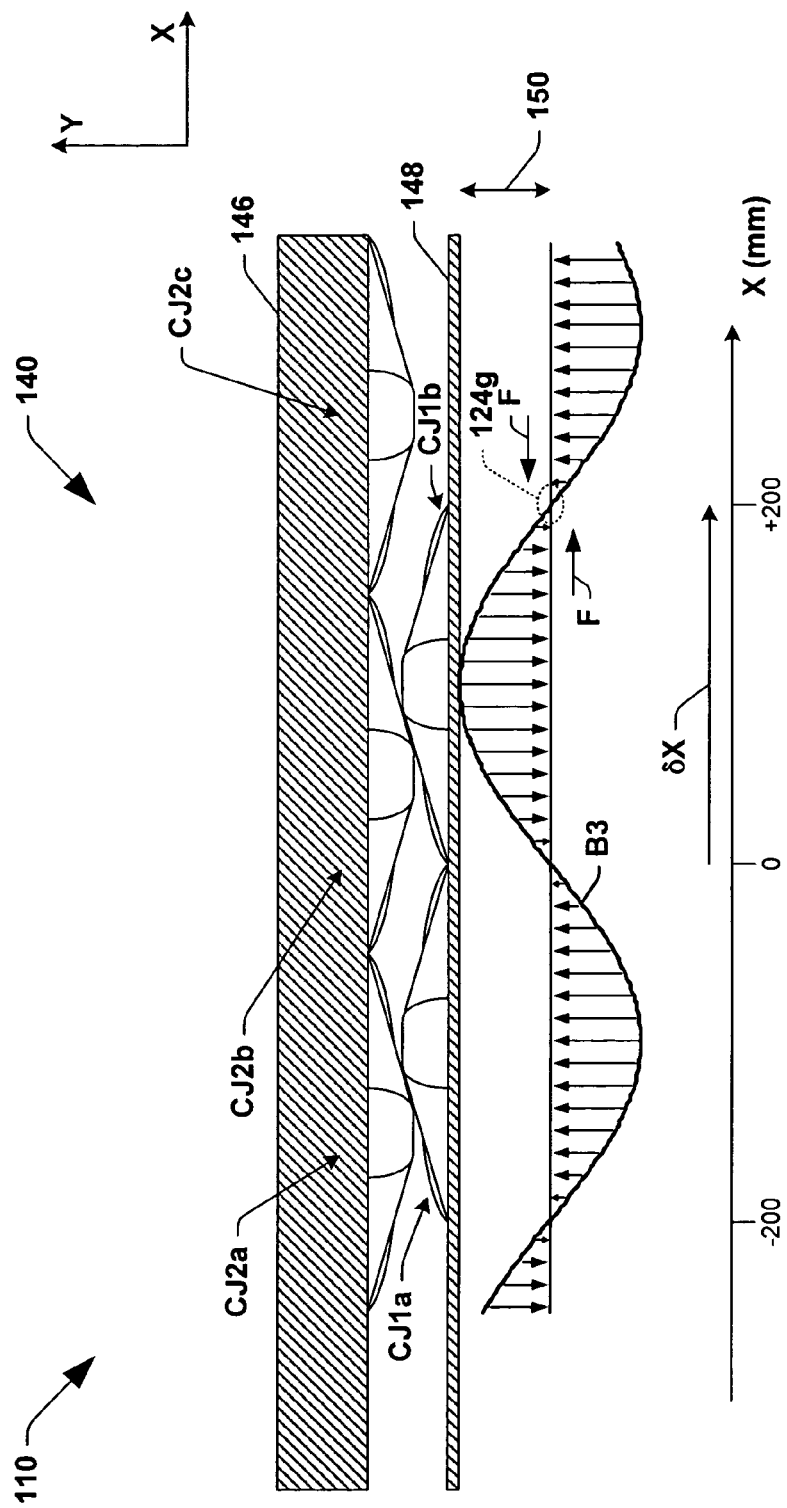
Figure 6D:
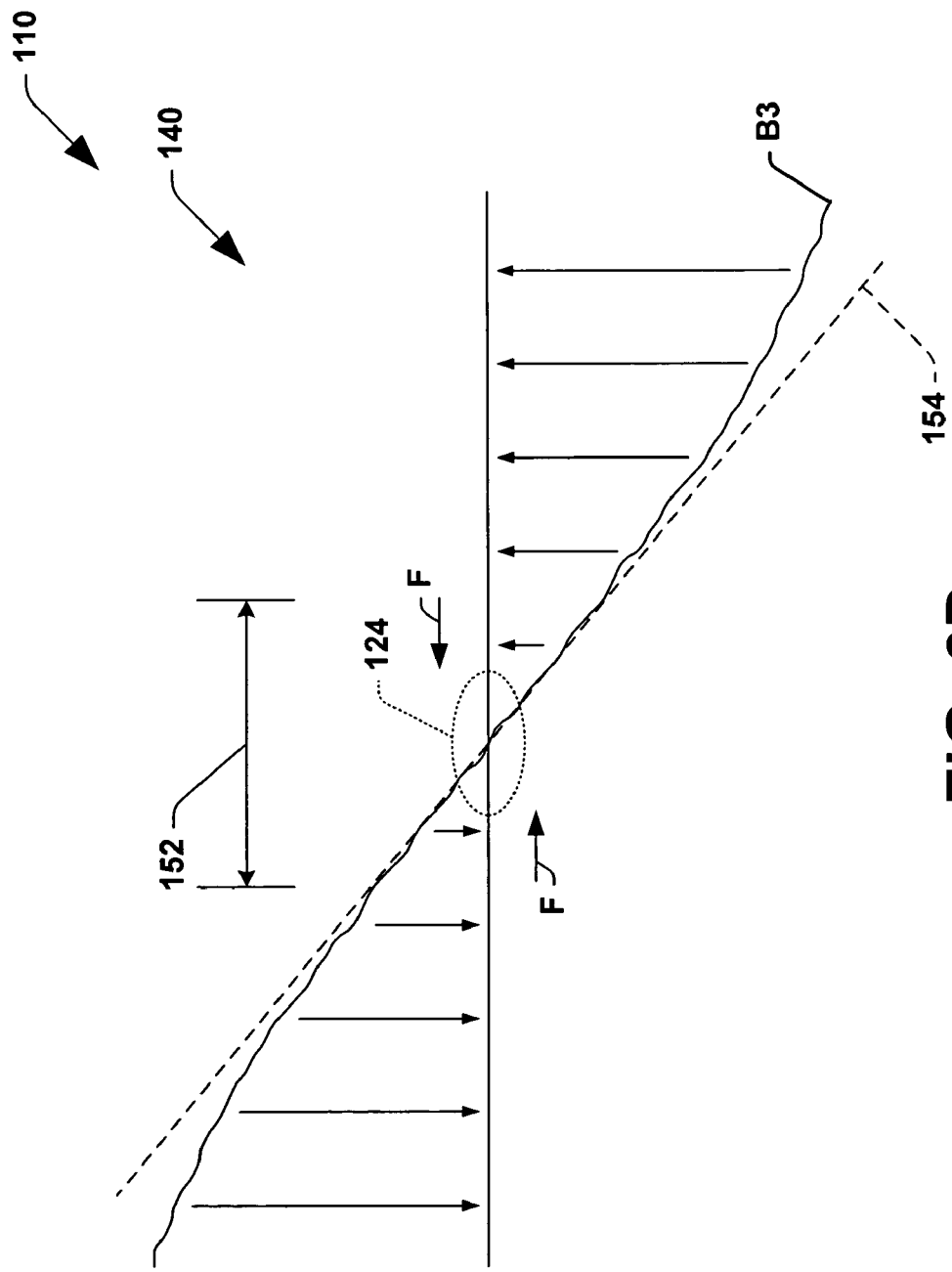
FIG. 6D is a partial end elevation view illustrating a generally linear magnetic field strength gradient of the exemplary first magnetic focusing field proximate the focusing field center in the first exemplary beam focusing system.
Figure 7:
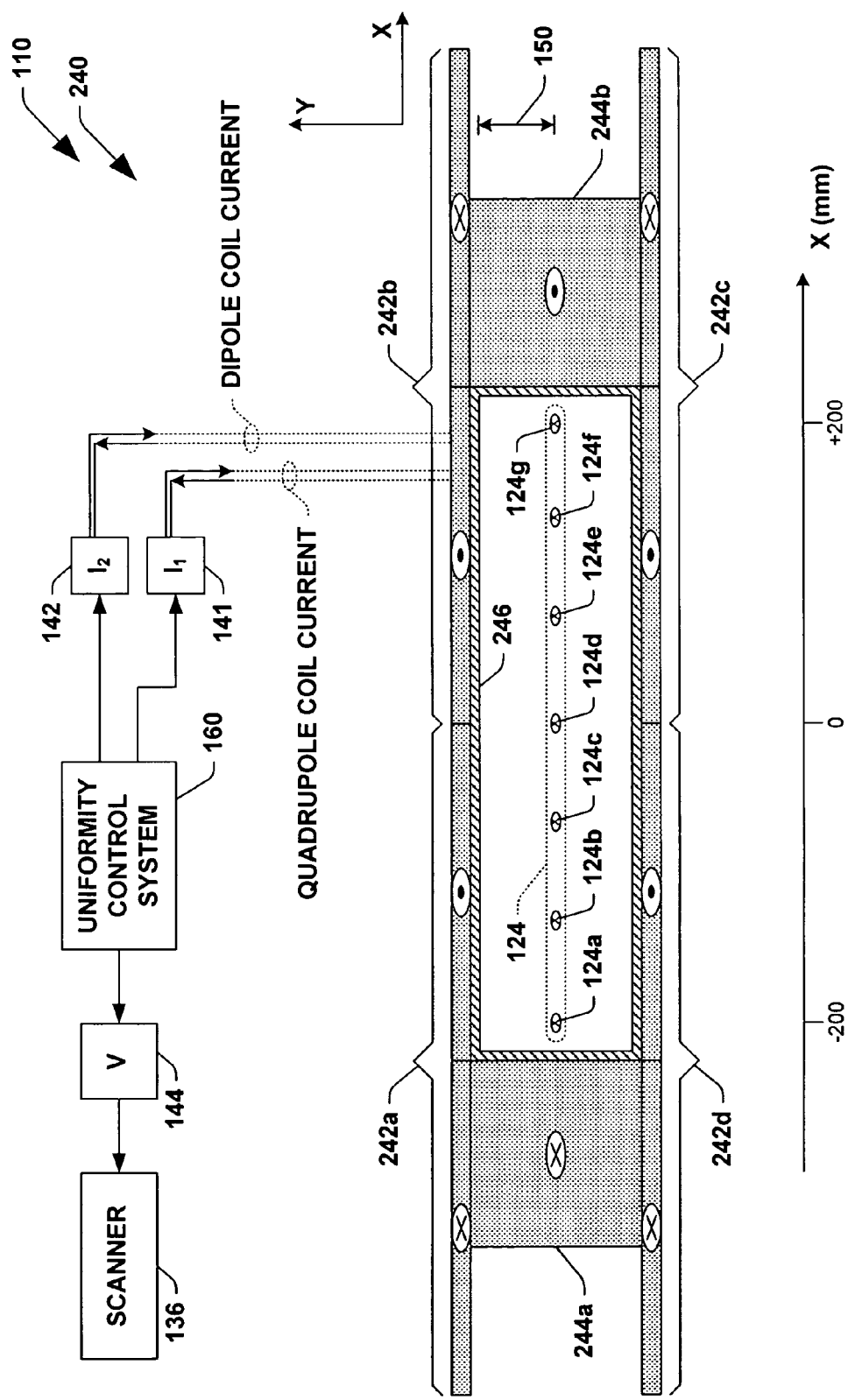
FIG. 7 is a partial end elevation view in section taken along line 7—7 in FIG. 2, illustrating a second exemplary beam focusing system with first and second magnets positioned above a generally horizontal beam scan plane to provide a magnetic focusing field through superposition of quadrupole and variable dipole magnetic fields, where the magnetic focusing field has a focusing field center in the scan plane that is generally coincident in space with the time-varying beam position along the scan direction in accordance with the invention.

Referring also to FIGS. 6A–6D, the wavelength λ in the illustrated focusing system 140 is selected to be large enough that the magnetic focusing field strength gradient is generally linear along the scan direction proximate the scanned beam 124, as illustrated shown in FIG. 6D. FIGS. 6A–6C illustrate further details of the exemplary magnetic focusing field B3 for three exemplary cases (e.g., δX=−200 mm in FIG. 6A, δX=0 mm in FIG. 6B, and δX =+200 mm in FIG. 6C), wherein the scanned beam 124 encounters a field gradient on either side of the beam position/focusing field center that tends to counteracts beam divergence. As shown in FIGS. 6A–6C, the magnetic focusing field B3 has several zero crossings along the length of the scan distance between X=−200 mm and X=+200 mm, wherein a positive ion beam 124 traveling in the direction out of the page will experience lateral (e.g., X-direction) converging forces F at zero crossings with a negative field gradient along the positive X direction (e.g., at the focusing field centers of the field B3). Conversely, the opposite polarity zero crossings would tend to laterally diverge a positive ion beam traveling in the same direction (out of the page in FIGS. 3A–3D). As shown in FIG. 6D, the selection of the wavelength distance λ of the focusing system magnet coils CJ provides a magnetic focusing field B3 having a field strength gradient that is generally linear in a lateral range 152 proximate the focusing center at the zero crossing, where the gradient of the exemplary field B3 approximates a straight line 152 within the region 152 which is wider than the scanned ion beam 124, although such linear or generally linear gradients are not a strict requirement of the invention.

Referring now to FIG. 7, another exemplary beam focusing system 240 is illustrated for use in focusing a scanned ion beam 124 in the ion implantation system 110 of FIG. 2. In this example, a first magnet is provided, having coils 242a, 242b, 242c, and 242d for providing a first magnetic field along a portion of the scan plane in the system 240 between the scanner 136 and the location of the workpiece 130, where the first magnetic field is a quadrupole field. In addition, the system 240 includes a second magnet comprising coils 244a and 244b providing a second magnetic field along the portion of the scan plane, where the second magnetic field is a dipole field. In the illustrated system 240, the quadrupole coils 242 are situated above and below a beamguide liner 246 such that coils carrying positive current in the direction out of the page in FIG. 7 are essentially at diagonal corners with respect to the center of the beam scan distance, by which a quadrupole magnetic field is created that tends to provide lateral (X-direction) focusing (convergence) and Y-direction (vertical) defocusing (divergence) of the beam 124d at the center of the scan range. However, this first (quadrupole) magnetic field alone also produces a displacement of the scanned beam 124 at non-zero values of δX, i.e. at non zero locations of x, it produces a quadrupole field centered on X that focuses the beam plus a dipole field that deflects the beam.

The second magnet coils 244a and 244b are situated along lateral sides of the liner 246 so as to create a vertical dipole magnetic field extending across the scan plane in the focusing system 240, which is additive with the quadrupole field, such that a composite magnetic focusing field is generated in the scan plane along the scan direction. The magnetic focusing field in the system 240 provides a laterally focusing field gradient at a certain x dimension, where the location of the focusing field center is determined by the amplitude of the dipole magnetic field. In this implementation, the quadrupole field strength is held generally constant (with the control system 160 controlling the first current source 141 to provide a generally constant first current $I_1$ to the coils 242), while the amplitude of the second magnetic field is varied over time according to the time-varying beam position along the scan direction (e.g., with the control system 160 setting dipole current $I_2$ generally proportional to the value of $\delta X$). In this manner, the variable dipole field offsets the dipole component produced by the quadrupole coil such that the focusing center of the resulting composite magnetic focusing field shifts along the scan direction to a location corresponding to the scanned beam position.

Thus, the implementation of FIG. 7 provides a traveling lens with a magnetic focusing field with a focal center that travels with the ion beam 124 as the beam 124 is scanned to different locations along the scan direction over time. The above examples are not exhaustive of the many possible focusing system of the invention, wherein any type of apparatus or system may be provided which creates a magnetic focusing field along a portion of the scan plane between the beam scanner 136 and the location of the workpiece 130, where the magnetic focusing field has a time-varying focusing field center in the scan plane that moves so as to be generally coincident in space with the time-varying beam position along the scan direction. It is noted that the exemplary beam focusing systems 140 and 240 illustrated and described above require no moving parts, thereby facilitating relatively high fast scan rates for scanning the ion beam 124 laterally, whereby high implantation system throughput may be achieved.

Referring now to FIG. 8, another aspect of the invention involves methods for focusing a scanned ion beam, wherein an exemplary method 300 is illustrated in FIG. 8. Although the method 300 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the devices and structures illustrated and described herein as well as in association with other structures not illustrated.

Beginning at 302, an ion beam is scanned at 304 in a scan plane, such as the horizontal scan plane in the exemplary implantation system 110 above. The scanned beam may optionally be collimated (e.g., parallelized) at 306 and final energy adjustment (e.g., acceleration or deceleration) may optionally be performed at 308, although not a requirement of the present invention. At 310, a magnetic focusing field is provided with a focusing field center in the scan plane, and the focusing field is adjusted at 312 such that the focusing field center is generally coincident with the beam position, after which the method 300 ends at 314. Any suitable focusing fields and field centers may be provided and adjusted at 310 and 312 as described above, for example, where the magnetic focusing field has a substantially sinusoidal distribution along the scan direction with a zero crossing at the focusing field center. Although illustrated in the context of magnetic focusing fields, other focusing field types may be used within the scope of the invention, including but not limited to electric focusing fields.

In one example, first and second magnetic fields are provided at 310 along a portion of the scan plane, wherein one or both of the first and second magnetic fields are adjusted at 312 such that the focusing field center is generally coincident with the time-varying beam position along the scan direction. In one possible implementation, the first magnetic field has a first substantially sinusoidal field distribution along the scan direction with a fixed first wavelength, and the second magnetic field has a second substantially sinusoidal field distribution along the scan direction with a fixed second wavelength, where the first and second wavelengths are substantially equal and the field distributions are offset from one another by a quarter wavelength along the scan direction. In this case, the magnetic focusing field is dynamically adjusted at 312 by varying amplitudes of the first and second magnetic fields over time according to the time-varying beam position such that the focusing field center is generally coincident with the time-varying beam position along the scan direction. In another possible implementation, the first magnetic field is a quadrupole field, and the second magnetic field is a dipole field, wherein dynamically adjusting the magnetic focusing field at 312 comprises varying an amplitude of the second magnetic field over time according to the time-varying beam position such that the focusing field center is generally coincident with the time-varying beam position along the scan direction.

While the invention has been illustrated and described with respect to one or more implementations, alterations and/or modifications may be made to the illustrated examples without departing from the spirit and scope of the appended claims. In particular regard to the various functions performed by the above described components or structures (blocks, units, engines, assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. An ion implantation system, comprising:
   an ion source operable to produce an ion beam;
   a beam scanner located downstream from the ion source, the beam scanner receiving the ion beam and directing a scanned ion beam in a scan plane toward a workpiece location, the scanned ion beam having a time-varying beam position along a scan direction; and
   a beam focusing system that provides a focusing field along a portion of the scan plane between the beam scanner and the workpiece location, the focusing field having a time-varying focusing field center in the scan plane, the beam focusing system being adapted to change the focusing field center position along the scan direction to be generally coincident in space with the time-varying beam position along the scan direction.

2. The ion implantation system of claim 1, wherein the focusing field is a magnetic focusing field with a time-varying magnetic focusing field center.

3. The ion implantation system of claim 2, wherein the magnetic focusing field has a substantially zero field strength at the focusing field center.

4. The ion implantation system of claim 3, wherein the magnetic focusing field has a magnetic field strength gradient that is generally linear along the scan direction proximate the focusing field center.

5. The ion implantation system of claim 2, wherein the magnetic focusing field has a magnetic field strength gradient that is generally linear along the scan direction proximate the focusing field center.

6. The ion implantation system of claim 2, wherein the magnetic focusing field has a substantially sinusoidal distribution along the scan direction with a zero crossing at the focusing field center.

7. The ion implantation system of claim 2, wherein the beam focusing system comprises:
   a first magnet providing a first magnetic field along the portion of the scan plane, the first magnetic field having a first substantially sinusoidal field distribution along the scan direction with a fixed first wavelength; and
   a second magnet providing a second magnetic field along the portion of the scan plane, the second magnetic field having a second substantially sinusoidal field distribution along the scan direction with a fixed second wavelength, the first and second wavelengths being substantially equal, the first and second substantially sinusoidal field distributions being offset from one another by a quarter wavelength along the scan direction;
   wherein the first and second magnetic fields are superimposed with one another along the portion of the scan plane to create the magnetic focusing field; and
   wherein amplitudes of the first and second magnetic fields are varied over time according to the time-varying beam position along the scan direction to provide the time-varying focusing field center of the magnetic focusing field generally coincident with the time-varying beam position along the scan direction.

8. The ion implantation system of claim 7, wherein the beam focusing system further comprises:
   a first current source providing a first variable current to windings of the first magnet;
   a second current source providing a second variable current to windings of the second magnet; and
   a control system coupled with the first and second current sources, the control system being adapted to vary the first and second variable currents according to the time-varying beam position along the scan direction to provide the time-varying focusing field center of the magnetic focusing field generally coincident with the time-varying beam position along the scan direction.

9. The ion implantation system of claim 8, wherein the control system is coupled with the beam scanner to control the time-varying beam position along the scan direction, and wherein the control system cooperatively controls the beam scanner, the first current source, and the second current source such that the scanned ion beam has a time-varying beam position along the scan direction and such that the focusing field center position is generally coincident with the time-varying beam position along the scan direction.

10. The ion implantation system of claim 7, wherein the magnetic focusing field has a substantially sinusoidal distribution along the scan direction with a zero crossing at the focusing field center.

11. The ion implantation system of claim 10, wherein the magnetic focusing field has a magnetic field strength gradient that is generally linear along the scan direction proximate the focusing field center.

12. The ion implantation system of claim 2, wherein the beam focusing system comprises:
   a first magnet providing a first magnetic field along the portion of the scan plane, the first magnetic field being a quadrupole magnetic field; and
   a second magnet providing a second magnetic field along the portion of the scan plane, the second magnetic field being a dipole magnetic field;
   wherein the first and second magnetic fields are superimposed with one another along the portion of the scan plane to create the magnetic focusing field; and
   wherein an amplitude of the second magnetic field is varied over time according to the time-varying beam position along the scan direction to provide the time-varying focusing field center of the magnetic focusing field generally coincident with the time-varying beam position along the scan direction.

13. The ion implantation system of claim 12, further comprising a control system coupled with the beam scanner and with the beam focusing system, wherein the control system cooperatively controls the time-varying beam position along the scan direction and the amplitude of the second magnetic field such that the scanned ion beam has a time-varying beam position along the scan direction and such that the focusing field center position is generally coincident with the time-varying beam position along the scan direction.

14. A beam focusing system for producing a magnetic focusing field along a portion of a scan plane between a beam scanner and a workpiece location in an ion implantation system, the beam focusing system comprising:
   a first magnet providing a first magnetic field along the portion of the scan plane; and
   a second magnet providing a second magnetic field superimposed on the first magnetic field along the portion of the scan plane, the first and second magnetic fields cooperatively providing a magnetic focusing field having a time-varying focusing field center generally corresponding to a time-varying beam position of a scanned ion beam along a scan direction.

15. The beam focusing system of claim 14, wherein the magnetic focusing field has a substantially zero field strength at the focusing field center.

16. The beam focusing system of claim 15, wherein the magnetic focusing field has a magnetic field strength gradient that is generally linear along the scan direction proximate the focusing field center.

17. The beam focusing system of claim 14, wherein the magnetic focusing field has a magnetic field strength gradient that is generally linear along the scan direction proximate the focusing field center.

18. The beam focusing system of claim 14, wherein the magnetic focusing field has a substantially sinusoidal distribution along the scan direction with a zero crossing at the focusing field center.

19. The beam focusing system of claim 14, wherein an amplitude of at least one of the first and second magnetic fields is varied over time according to the time-varying beam position along the scan direction to provide the time-varying focusing field center of the magnetic focusing field generally corresponding to the time-varying beam position along the scan direction.

20. The beam focusing system of claim 14, wherein the first magnetic field has a first substantially sinusoidal field distribution along the scan direction with a fixed first wavelength, wherein the second magnetic field has a second substantially sinusoidal field distribution along the scan direction with a fixed second wavelength, wherein the first and second wavelengths are substantially equal, wherein the first and second substantially sinusoidal field distributions are offset from one another by a quarter wavelength along the scan direction, and wherein amplitudes of the first and second magnetic fields are varied over time according to the time-varying beam position along the scan direction to provide the time-varying focusing field center of the magnetic focusing field generally corresponding to the time-varying beam position along the scan direction.

21. The beam focusing system of claim 20, wherein the beam focusing system further comprises:
a first current source providing a first variable current to windings of the first magnet;
a second current source providing a second variable current to windings of the second magnet; and
a control system coupled with the first and second current sources, the control system being adapted to vary the first and second variable currents according to the time-varying beam position along the scan direction to provide the time-varying focusing field center of the magnetic focusing field generally coincident with the time-varying beam position along the scan direction.

22. The beam focusing system of claim 14, wherein the first magnetic field is a quadrupole magnetic field, wherein the second magnetic field is a dipole magnetic field, and wherein an amplitude of the second magnetic field is varied over time according to the time-varying beam position along the scan direction to provide the time-varying focusing field center of the magnetic focusing field generally corresponding to the time-varying beam position along the scan direction.

23. A method of focusing a scanned ion beam along a portion of a scan plane between a beam scanner and a workpiece location in an ion implantation system, the method comprising:
providing a focusing field having a focusing field center in the scan plane; and
dynamically adjusting the focusing field such that the focusing field center is generally coincident with a time-varying beam position of the scanned ion beam along the scan direction.

24. The method of claim 23, wherein the focusing field is a magnetic focusing field with a time-varying magnetic focusing field center.

25. The method of claim 24, wherein the magnetic focusing field has a substantially zero field strength at the focusing field center.

26. The method of claim 24, wherein providing the magnetic focusing field comprises providing a first magnetic field along the portion of the scan plane, and providing a second magnetic field superimposed on the first magnetic field along the portion of the scan plane; and wherein dynamically adjusting the magnetic focusing field comprises adjusting one or both of the first and second magnetic fields such that the focusing field center is generally coincident with the time-varying beam position along the scan direction.

27. The method of claim 26, wherein the first magnetic field has a first substantially sinusoidal field distribution along the scan direction with a fixed first wavelength; wherein the second magnetic field has a second substantially sinusoidal field distribution along the scan direction with a fixed second wavelength; wherein the first and second wavelengths are substantially equal; wherein the first and second substantially sinusoidal field distributions are offset from one another by a quarter wavelength along the scan direction; and wherein dynamically adjusting the magnetic focusing field comprises varying amplitudes of the first and second magnetic fields over time according to the time-varying beam position along the scan direction such that the focusing field center is generally coincident with the time-varying beam position along the scan direction.

28. The method of claim 26, wherein the first magnetic field is a quadrupole magnetic field; wherein the second magnetic field is a dipole magnetic field; and wherein dynamically adjusting the magnetic focusing field comprises varying an amplitude of the second magnetic field over time according to the time-varying beam position along the scan direction such that the focusing field center is generally coincident with the time-varying beam position along the scan direction.

29. The method of claim 23, wherein the magnetic focusing field has a substantially sinusoidal distribution along the scan direction with a zero crossing at the focusing field center.

* * * * *